United States Patent [19]
Ueda

[11] Patent Number: 6,100,565
[45] Date of Patent: Aug. 8, 2000

[54] SEMICONDUCTOR INTEGRATED CIRCUIT DEVICE WITH OPERATION IN PARTIAL DEPLETION TYPE MODE AND PERFECT DEPLETION TYPE MODE

[75] Inventor: Kimio Ueda, Tokyo, Japan

[73] Assignee: Mitsubishi Denki Kabushiki Kaisha, Tokyo, Japan

[21] Appl. No.: 08/994,050

[22] Filed: Dec. 19, 1997

[30] Foreign Application Priority Data

Aug. 28, 1997 [JP] Japan ..................................... 9-232621

[51] Int. Cl.$^7$ ...................................................... H01L 27/01
[52] U.S. Cl. ........................... 257/348; 257/351; 257/392; 257/402
[58] Field of Search ..................................... 257/348, 350, 257/351, 392, 402, 369

[56] References Cited

U.S. PATENT DOCUMENTS

| | | | |
|---|---|---|---|
| 3,473,094 | 10/1969 | Dillon, Jr. ................................ | 257/203 |
| 4,665,423 | 5/1987 | Akiya ....................................... | 257/379 |
| 5,463,238 | 10/1995 | Takahashi et al. ....................... | 257/374 |
| 5,656,825 | 8/1997 | Kusumoto et al. ...................... | 257/347 |

FOREIGN PATENT DOCUMENTS 6-291265  10/1994  Japan .

OTHER PUBLICATIONS

T. Douseki et al., "TP 5.4: A 0.5V SIMOX–MTCMOS Circuit With 200ps Logic Gate," 1996 IEEE International Solid–State Circuits Conference, vol. Thirty–Nine, ISSN 0193–6530, Feb. 8, 9 and 10, 1996, cover page, and pp. 84, 85, 423.

*Primary Examiner*—Mark V. Prenty
*Attorney, Agent, or Firm*—Burns, Doane, Swecker & Mathis, LLP

[57] ABSTRACT

MOS devices are formed on a wafer having a thick silicon layer 3a and a thin silicon layer 3b formed on a buried oxide film. The MOS device formed in the thick silicon layer 3a is activated in a partial depletion type mode. Further, the MOS device formed in the thick silicon layer 3b is activated in a perfect depletion type mode. Therefore, a low leakage current and a high-speed operation can be achieved simultaneously. It is thus possible to solve problems that an integrated circuit must be formed by either one of the partial depletion type device and the perfect depletion type device, and the low leakage current and the high-speed operation are hard to come to fruition simultaneously.

4 Claims, 6 Drawing Sheets

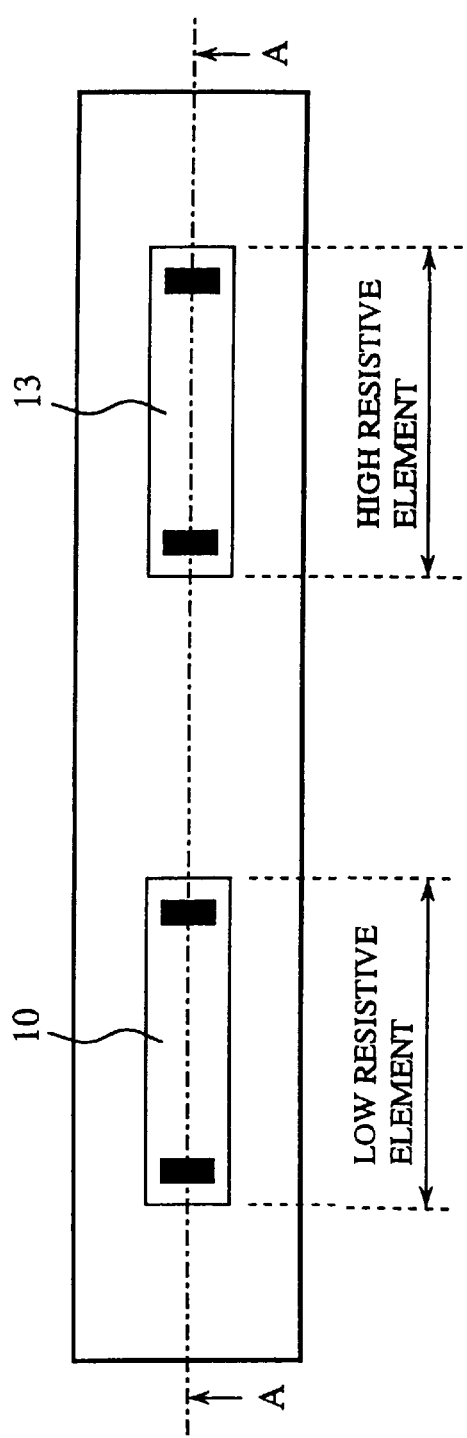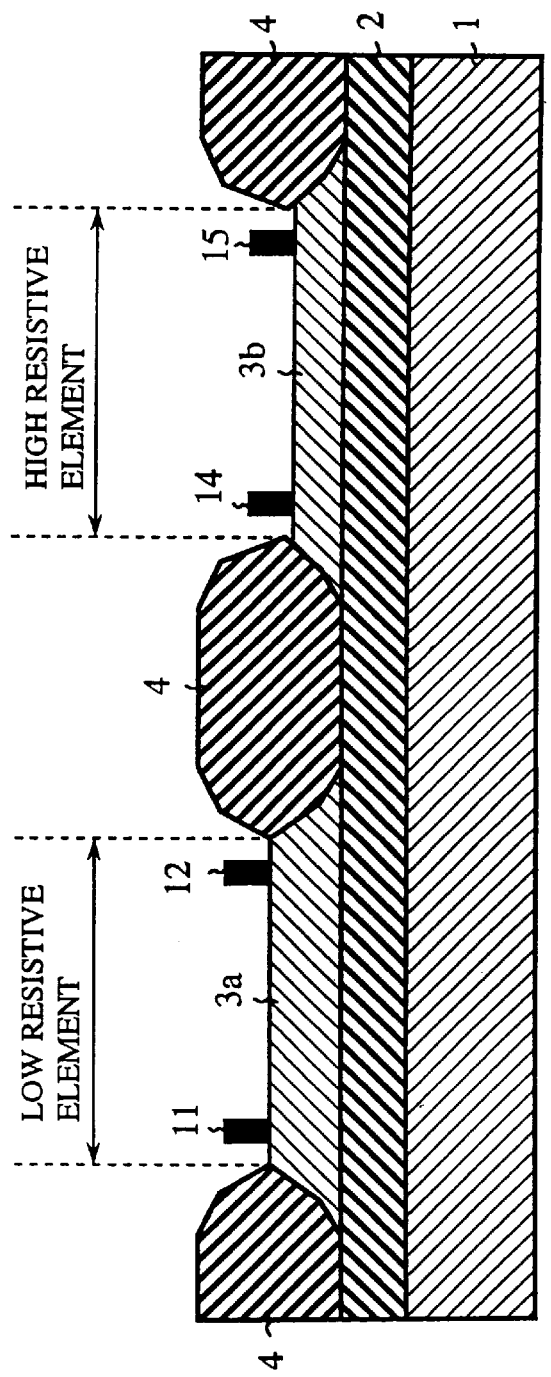
FIG.7A
FIG.7B

SEMICONDUCTOR INTEGRATED CIRCUIT DEVICE WITH OPERATION IN PARTIAL DEPLETION TYPE MODE AND PERFECT DEPLETION TYPE MODE

BACKGROUND OF THE INVENTION

1. Field of the Invention:

The present invention relates to a semiconductor integrated circuit device using MOS transistors formed in silicon layers on a buried oxide film (SOI: Silicon On Insulator).

2. Description of the Prior Art:

Each of CMOS devices (SOI/CMOS devices) formed in silicon layers (hereinafter suitably called SOI) on a buried oxide film has a Junction capacitance smaller than that of a normal CMOS device (bulk/CMOS device) formed in a well region and operates at high speed and with low power consumption. The SOI/CMOS devices are classified into two from the viewpoint of operating modes. Namely, they are classified into a perfect depletion type mode and a partial depletion type mode to be described later.

FIG. 10 is a cross-sectional view showing an NMOS transistor activated in a conventional perfect depletion type mode. In FIG. 10, reference numeral 101, reference numeral 102, reference numeral 103, reference numeral 104, reference numeral 105, reference numeral 106, reference numeral 107, reference numeral 108 and reference numeral 109 indicate a silicon substrate, a buried oxide film, a silicon layer, an oxide film, a gate oxide film, a gate electrode, a gate terminal, a source terminal and a drain terminal, respectively.

A voltage greater than or equal to a threshold voltage of the NMOS transistor is applied to the gate terminal 107. The transistor exhibits an ON state. In this condition, a channel region 110 for the NMOS transistor is formed below the gate electrode 106. A region (body region) located therebelow is perfectly depleted so as to form a depletion layer 111. A device activated in a state in which the body region is fully being depleted under the circumstances of the transistor being held ON in this way, is called perfect depletion type device.

FIG. 11 is a cross-sectional view showing a partial depletion type device. In FIG. 11, reference numeral 112 indicates a P+ body region. A voltage greater than or equal to a threshold voltage of an NMOS transistor is applied to a gate terminal 107. The transistor exhibits an ON state. Even if the transistor is in the ON state, the P+ body region 112 exists in a portion below a depletion layer 111. Such a device is called partial depletion type device.

The operation will be next described.

If a comparison is performed between the two, then the perfect depletion type device has an S factor smaller than that of the partial depletion type device. Accordingly, a leakage current is small in the perfect depletion type device.

Owing to control on the potential of the P+ body region 112, the partial depletion type device can be reduced in threshold voltage in the ON state and activated at high speed.

Further, owing to the fixing of the potential of the body region, the partial depletion type device can improve a transistor withstand voltage as compared with the perfect depletion type device.

FIG. 12 is a view typically showing the symbol of an NMOS transistor. In FIG. 12, reference numeral 113 indicates a body terminal.

The operation of the NMOS transistor will next be described.

If the body terminal 113 of the NMOS transistor is used with being connected to a gate terminal 107, then a current that flows when the transistor is turned ON, increases so that a logic circuit is activated at high speed.

The body terminal 113 is normally used with being connected to a source terminal 108 of the transistor. If a voltage greater than or equal to the threshold voltage is applied between the source terminal 108 and the gate terminal 107, then the transistor is turned ON so that a current flows between a drain terminal 109 and the source terminal 108.

FIG. 13 is a graph showing the relationship between a voltage (Vds) applied between source/drain terminals and a current (Ids) that flows between the source/drain terminals. Referring to FIG. 13, each broken line indicates a current (Ids) flowing between the source/drain terminals when the voltage above the threshold voltage is applied between the source/gate terminals of the NMOS transistor. A large current flows as the voltage applied between the source/gate terminals increases.

Further, each solid line indicates a current (Ids) that flows between the source/drain terminals when the gate terminal is electrically connected to the body terminal. A very large current flows as compared with the case where the body terminal is electrically connected to the source terminal.

The MOS transistor circuit is logically operated by charging or discharging its output capacity through the current. Thus, the circuit using the transistor in which the body terminal is electrically connected to the source terminal, produces a large current between the source/drain terminals and is activated at high speed as compared with the normal circuit. The current that flows in the transistor wherein the body terminal is electrically connected to the gate terminal, increases because a back-gate bias effect is reduced and the threshold voltage of the transistor is lowered.

Since the back-gate bias effect is reduced as the voltage at the body terminal becomes greater than that at the source terminal as is already known, the threshold voltage of the NMOS transistor becomes low. Since the back-gate bias effect is reduced as the voltage at the body terminal becomes lower than that at the source terminal, the threshold voltage of the PMOS transistor becomes low.

These phenomena normally noticeably occur in the partial depletion type device whose body region is not perfectly depleted and do not appear in the perfect depletion type device whose body region is perfectly depleted.

Further, a resistive element is often used in a semiconductor circuit. The resistive element is formed by a diffused region (diffused resistance) formed in a bulk well region. The resistive element is realized by adding a process for forming the resistance of polysilicon (polysilicon resistance) set to a desired resistance value to the general process step.

The diffused resistance can be implemented without a change in normal process step. However, a depletion layer capacitance developed between the well and the diffused region is large and hence a large loss is produced when the diffused resistance operates at a high frequency.

On the other hand, the polysilicon resistance can be reduced in parasitic capacitance and used even in a high frequency region. Since, however, the number of process steps increases, this will result in an increase in chip cost.

Incidentally, JP-A-6/291265 discloses, for example, a CMOS integrated circuit wherein an NMOS transistor is formed in a thick silicon layer portion on a silicon oxide film and a PMOS transistor is formed in a thin silicon layer portion. However, each of the formed devices is different in type from that obtained by the invention of the present application.

SUMMARY OF THE INVENTION

The conventional semiconductor integrated circuit device has a problem in that the semiconductor integrated circuit device must be formed by either the partial depletion type device or the perfect depletion type device and hence a low leakage current and a high-speed operation are hard to be achieved simultaneously.

Further, the resistive element formed by the diffused resistance has a problem in that the depletion layer capacitance developed between the well and the diffused region is large and the loss becomes great when it operates at the high frequency.

Moreover, the resistive element formed by the polysilicon resistance has a problem in that the number of the process steps must be increased and hence the increase in chip cost is incurred.

With the foregoing problems in view, it is therefore an object of the present invention to provide a semiconductor integrated circuit device that a partial depletion type device and a perfect depletion type device are formed on the same chip so as to simultaneously achieve a low leakage current and a high-speed operation.

It is another object of the present invention to provide a semiconductor integrated circuit device capable of easily fabricating a partial depletion type device and a perfect depletion type device on the same chip in parts.

It is a further object of the present invention to provide a semiconductor integrated circuit device which is capable of being reduced in parasitic capacitance and used even at a high frequency by utilizing a silicon layer thick in film thickness and a silicon layer thin in film thickness as a low resistive element and a high resistive element respectively and which requires no special process steps.

It is a still further object of the present invention to provide a semiconductor integrated circuit device capable of bringing a circuit into integration in high density, providing high reliability and achieving a reduction in chip cost.

According to a first aspect of this invention, for achieving the above objects, there is provided a semiconductor integrated circuit device comprising:

MOS devices respectively formed on a wafer having a thick silicon layer and a thin silicon layer formed on a buried oxide film, the MOS device formed in the thick silicon layer being activated in a partial depletion type mode and the MOS device formed in the thin silicon layer being activated in a perfect depletion type mode. Thus, an advantageous effect is brought about in that a semiconductor integrated circuit device equipped with a perfect depletion type device and a partial depletion type device on one chip in a mixed form can be obtained and hence a low leakage current and a high-speed operation both corresponding to merits of the devices can be simultaneously achieved.

According to a second aspect of this invention, there is provided a semiconductor integrated circuit device that each MOS device has a CMOS structure. Therefore, an advantageous effect is brought about in that the most suitable low leakage current and high-speed operation can be simultaneously achieved even if a PMOS transistor and an NMOS transistor are disposed in mixed form.

According to a third aspect of this invention, there is provided a semiconductor integrated circuit device that a thermal oxide film formed by selectively thermally-oxidizing a thick silicon layer is etched to thereby form a thin silicon layer and a device formed in the thin silicon layer is activated in a perfect depletion type mode. Thus, an advantageous effect is brought about in that the silicon layers different in film thickness from each other can be easily obtained and the semiconductor integrated circuit device is activated at high speed.

According to a fourth aspect of this invention, there is provided a semiconductor integrated circuit device that a MOS device operating at the perfect depletion type mode has a body potential used in floating and a MOS device operating at the partial depletion type mode has a body potential fixed to a power level, a GND level or another potential or controlled in synchronism with a switching operation thereof. Thus, an advantageous effect is brought about in that a circuit can be brought into integration in high density and an improvement in reliability and a reduction in chip cost owing to a chip area reduction can be achieved. Another advantageous effect is brought about in that the electrical connection of body electrodes to their corresponding gate terminals permits a high-speed operation and particularly when the body electrodes are used in a region for driving large capacity of an input/output buffer or the like, they provide a great merit, whereby an integrated circuit having a high-speed operation can be obtained.

According to a fifth aspect of this invention, there is provided a semiconductor integrated circuit device that a thick silicon layer is used as a low resistive element and a thin silicon layer is used as a high resistive element. Thus, an advantageous effect is brought about in that the bottoms of the silicon layers are reduced in parasitic capacity because of being placed in contact with the buried oxide film and can be used even at a high frequency. Further, another advantageous effect is brought about in that since no particular process steps are required upon fabrication, a chip can be reduced in manufacturing cost.

According to a sixth aspect of this invention, there is provided a semiconductor integrated circuit device further including input/output buffer regions activated in a partial depletion type mode and an internal circuit region activated in a perfect depletion type mode. Owing to such a construction, the internal circuit region no requires a body contact region and allows the integration of a circuit in high density. Thus, an advantageous effect is brought about in that a high-density SOI integrated circuit equipped with high withstand-voltage input/output buffer regions can be obtained, and an improvement in reliability and a reduction in chip cost owing to a chip area reduction can be achieved.

According to a seventh aspect of the invention, there is provided a semiconductor integrated circuit device that gate electrodes of the CMOS including PMOS and NMOS are connected to their body electrodes respectively, thereby achieving high speed operation.

Typical ones of various inventions of the present application have been shown in brief. However, the various inventions of the present application and specific configurations of these inventions will be understood from the following description.

BRIEF DESCRIPTION OF THE DRAWINGS

Other objects and advantages of the present invention will be more completely understood from the following detailed description, taken in conjunction with the accompanying drawings wherein:

FIGS. 7A and 7B show resistive elements employed in a second embodiment of the present invention, wherein FIG. 7A is a plan view of the resistive elements and FIG. 7B is a cross-sectional view taken along line A—A in FIG. 7A;

DETAILED DESCRIPTION OF THE PREFERRED EMBODIMENTS

Preferred embodiments of the present invention will hereinafter be described with reference to the accompanying drawings.

First Embodiment

Figure 1:
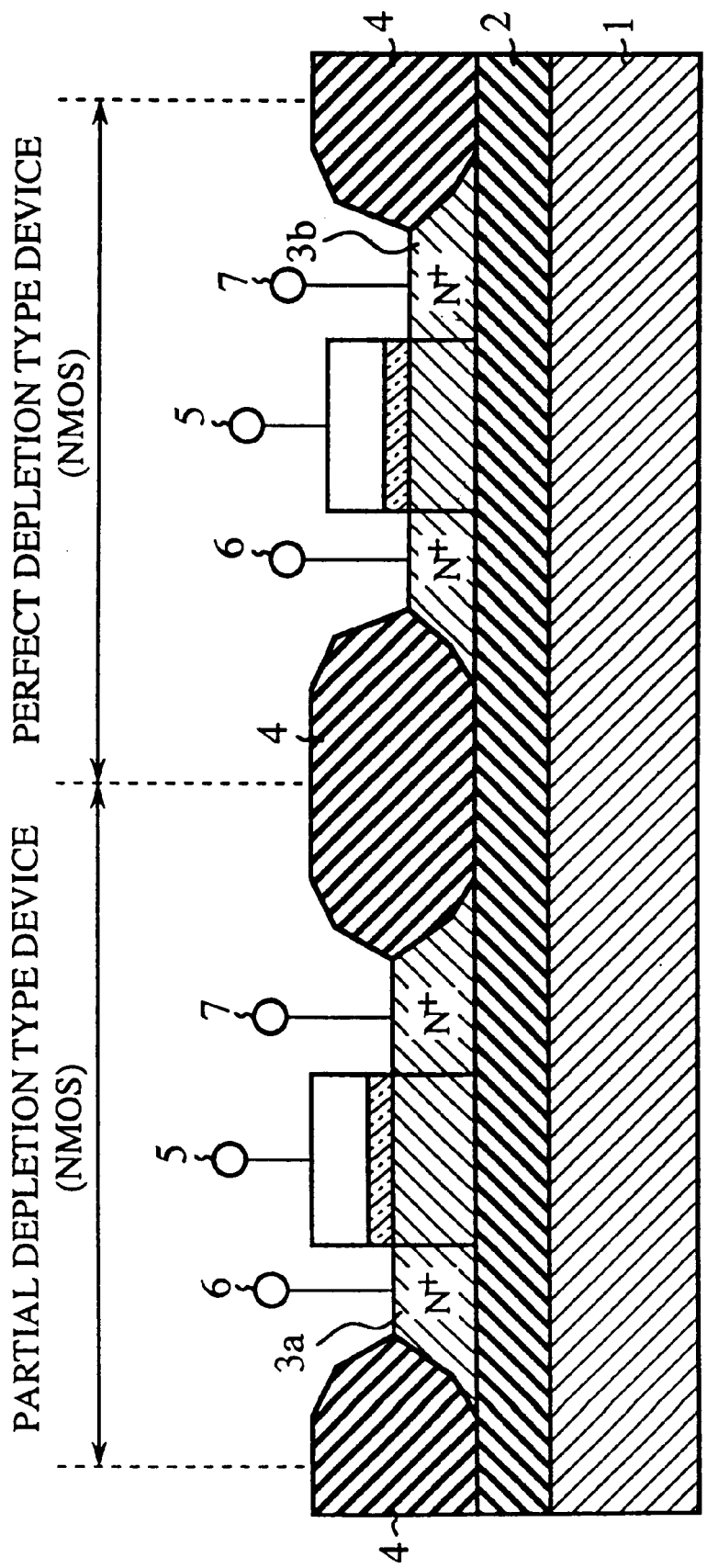
FIG. 1 is a cross-sectional view showing NMOS transistors employed in a first embodiment of the present invention.

FIG. 1 is a cross-sectional view showing NMOS transistors employed in a first embodiment of the present invention. In FIG. 1, reference numerals 1, reference numeral 2, reference numeral 3a reference numeral 3b, reference numeral 4, reference numeral 5, reference numeral 6 and reference numeral 7 indicate a silicon substrate, a buried oxide film, a thick silicon layer, a thin silicon layer, an oxide film, a gate terminal, a source terminal and a drain terminal, respectively. Thus, the NMOS transistors are respectively formed in the thick silicon layer 3a and the thin silicon layer 3b on the buried oxide film 2.

Figure 2:
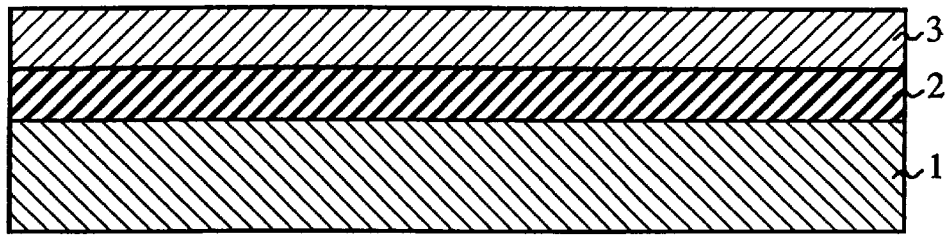
FIG. 2 is a cross-sectional view illustrating an SOI substrate prior to a change in thickness of a silicon layer.

A method of forming the thick silicon layer 3a and the thin silicon layer 3b will next be described with reference to FIGS. 2 through 6. FIG. 2 is a cross-sectional view illustrating an SOI substrate prior to a change in thickness of a silicon layer, FIG. 3 is a cross-sectional view depicting an SOI substrate with a nitride film formed thereon, FIG. 4 is a cross-sectional view showing an SOI substrate having a nitride film processed into a desired shape, FIG. 5 is a cross-sectional view illustrating an SOI substrate having a thermal oxide film formed by thermal oxidation, and FIG. 6 is a cross-sectional view depicting an SOI substrate having silicon layers different in thickness from each other.

Figure 3:
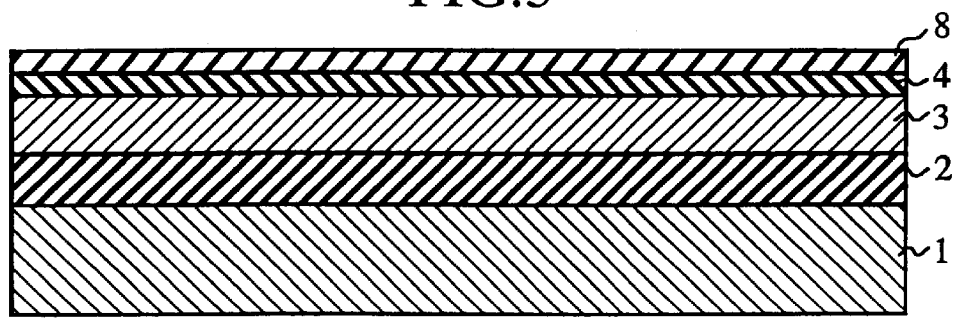
FIG. 3 is a cross-sectional view depicting an SOI substrate with a nitride film formed thereon.

The SOI substrate shown in FIG. 2 is first oxidized to form an oxide film ($SiO_2$) 4 as shown in FIG. 3. Further, a nitride film ($Si_3N_4$) 8 is formed on the oxide film 4.

Figure 4:
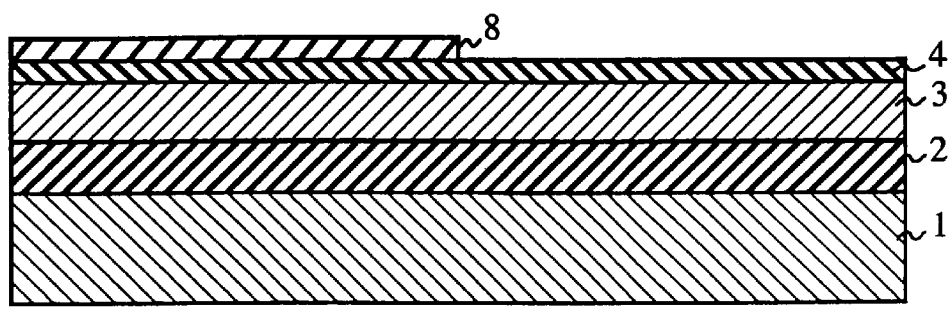
FIG. 4 is a cross-sectional view showing an SOI substrate having a nitride film processed into a desired shape.

Thereafter, the nitride film 8 located in a predetermined range is removed by the photoengraving technique and the etching technique to thereby process the nitride film 8 into a desired form as shown in FIG. 4.

Figure 5:
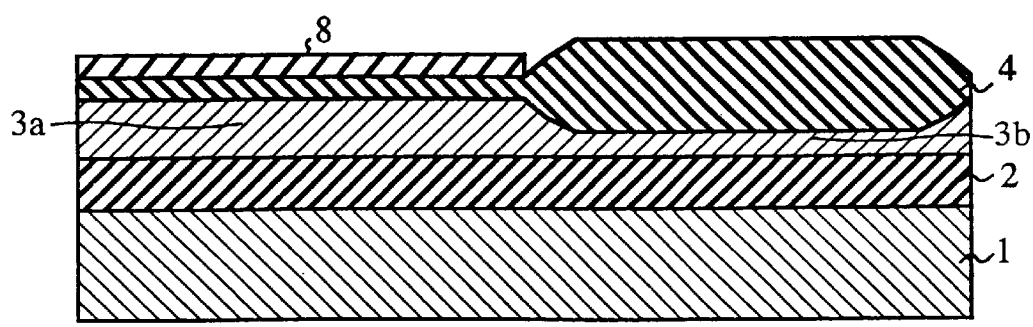
FIG. 5 is a cross-sectional view illustrating an SOI substrate having a thermal oxide film formed by thermal oxidation.
Figure 6:
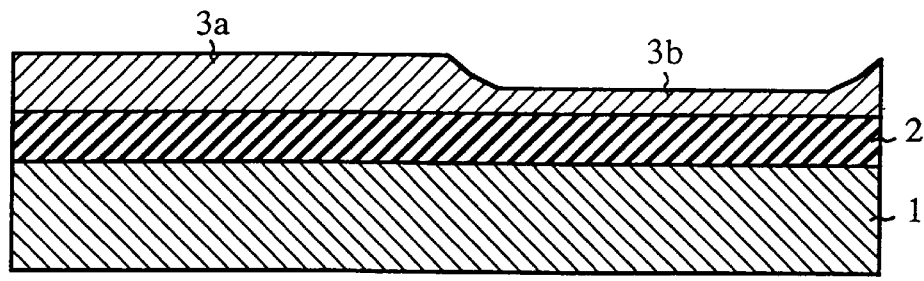
FIG. 6 is a cross-sectional view depicting an SOI substrate having silicon layers different in thickness from each other.

As shown in FIG. 5, an oxide film (thermal oxide film) 4 is next formed by thermal oxidation. If the nitride film 8 and the oxide film 4 are thereafter removed, then a substrate having a thick silicon layer 3a and a thin silicon layer 3b can be formed as shown in FIG. 6.

Thereafter, if MOS devices are formed in the respective silicon layers 3a and 3b respectively in accordance with a normal SOI device process step, then a structure shown in FIG. 1 can be obtained. Incidentally, the oxide film 4 shown in FIG. 1 is one formed by subjecting the oxide film 4 to thermal oxidation in the thermal oxidation process shown in FIG. 5 until it reaches the buried oxide film 2.

The operation of the present embodiment will next be described.

When the voltage is applied to the gate terminal 5, a body region of the NMOS transistor formed in the thin silicon layer 3b is perfectly depleted, whereas a body region of the NMOS transistor formed in the thick silicon layer 3a is not perfectly depleted. A P+ body region in which holes are stored as majority carriers exists in some of the latter body region.

Thus, the NMOS transistor formed in the thin silicon layer 3b is activated in a perfect depleting mode so as to allow a reduction in leakage current. The NMOS transistor formed in the thick silicon layer 3a is activated in a partial depleting mode so as to be able to operate at high speed.

The devices comprised of the NMOS transistors alone have been described above. It is however needless to say that a CMOS device comprised of mixed NMOS and PMOS transistors or a device made up of either of PMOS and NMOS transistors alone can be also applied.

According to the first embodiment, as described above, an integrated circuit in which the perfect depletion type device and the partial depletion type device are placed on one chip in mixed form can be obtained. Further, an advantageous effect can be obtained in that an integrated circuit for simultaneously implementing a low leakage current and a high-speed operation representative of merits of the devices can be provided.

Second Embodiment

FIG. 7A is a plan view showing resistive elements employed in a second embodiment of the present invention and FIG. 7B is a cross-sectional view taken along line A—A in FIG. 7A. In the following illustrated embodiment, the same components as or corresponding to the components already shown in the drawings are identified by the same reference numerals and their description will be omitted.

In FIG. 7, reference numeral 10, reference numerals 11 and 12, reference numeral 13, and reference numerals 14 and 15 indicate a low resistive element, connecting points of the low resistive element 10, a high resistive element, and connecting points of the high resistive element 13 respectively.

As described above, a thick silicon layer 3a and a thin silicon layer 3b are formed by selectively subjecting a substrate to thermal oxidation. At this time, an oxide film 4 is formed by thermal oxidation until it reaches a buried oxide film 2. Thus, the low resistive element 10 and the high resistive element 13 are formed on one chip in separate form.

The operation of the present embodiment will next be described.

In general, a current that flows into a resistive element is approximately proportional to the thickness of a silicon layer. Thus, the low resistive element 10 and the high resistive element 13 can be easily fabricated in parts by forming the thick silicon layer 3a and the thin silicon layer 3b on one chip in the above-described directions.

According to the second embodiment, as described above, an advantageous effect can be obtained in that the bottoms of the thick silicon layer 3a and the thin silicon layer 3b are reduced in parasitic capacity because of being placed in contact with the buried oxide film 2, and they can be used even at a high frequency.

Further, an advantageous effect can be obtained in that since no particular process steps are required upon fabrication, a chip can be lowered in manufacturing cost.

Third Embodiment

Figure 8:
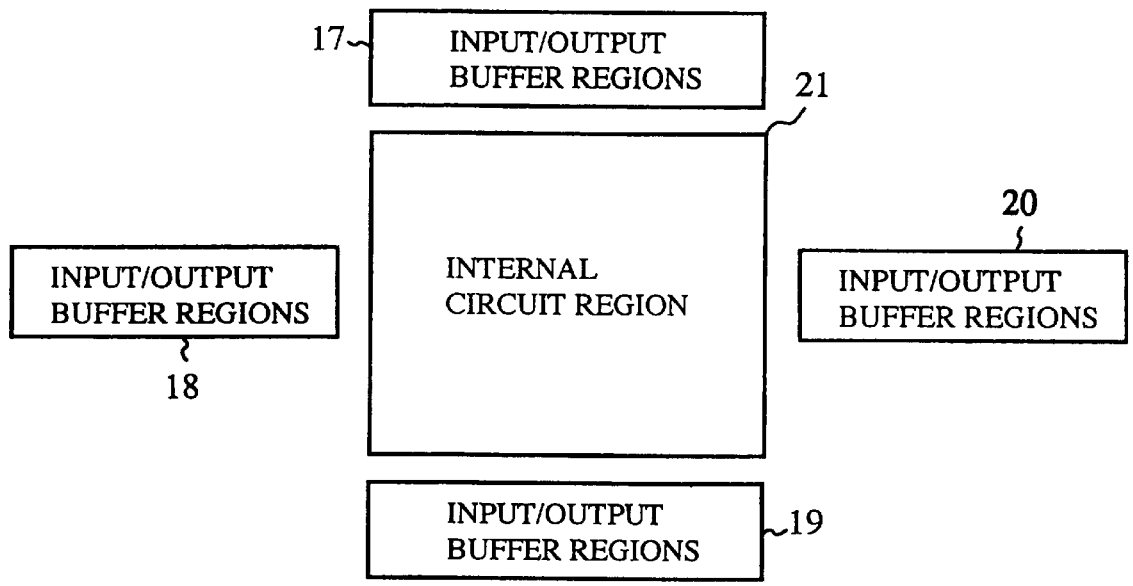
FIG. 8 is a block diagram showing a semiconductor integrated circuit device according to a third embodiment of the present invention.

FIG. 8 is a block diagram showing a semiconductor integrated circuit device according to a third embodiment of the present invention. In FIG. 8, reference numerals 17, 18, 19 and 20 indicate input/output buffer regions respectively and reference numeral 21 indicates an internal circuit region.

The operation of the present embodiment will next be described.

The input/output buffer regions 17, 18, 19 and 20 transfer signals to and from the outside of a chip and drive large capacity. Accordingly, a transistor large in gate width is used for each of the input/output buffer regions 17, 18, 19 and 20. A transistor withstand voltage of an SOI device is reduced as the gate width becomes large. Thus, the input/output buffer regions 17, 18, 19 and 20 are constructed by the above-described partial depletion type devices respectively. Their body regions are fixed to an unillustrated power level so as to improve the transistor withstand voltage.

On the other hand, the internal circuit region 21 utilizes the above-described perfect depletion type device. Since its body region is perfectly depleted, the effect of fixing the potential applied to the body region is small even if its potential is fixed. Thus, the potential applied to the body region of the perfect depletion type device is used in floating.

According to the third embodiment, as described above, the internal circuit region 21 constructed by the perfect depletion type device no requires the body contact region and allows the integration of a circuit in high density. Thus, an advantageous effect can be brought about in that a high-density SOI integrated circuit equipped with the high withstand-voltage input/output buffer regions 17, 18, 19 and 20 can be obtained, and an improvement in reliability and a reduction in chip cost owing to a chip area reduction can be achieved.

The third embodiment has described the case in which each of the input/output buffer regions 17, 18, 19 and 20 is constructed by the partial depletion type device and the body region thereof is fixed to the unillustrated power level. However, the present invention is not necessarily limited to this. The body region may be fixed to a GND level or another potential, or may be controlled in synchronism with the switching operation of the device. Even in this case, an advantageous effect can be obtained in that a circuit can be brought into integration in high density and an improvement in reliability and a reduction in chip cost can be achieved.

Fourth Embodiment

Figure 9:
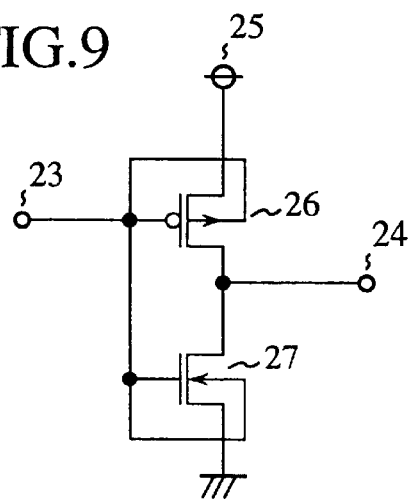
FIG. 9 is a configurational view illustrating inverter gates whose body voltages are controlled, which are employed in a fourth embodiment of the present invention.
Figure 10:
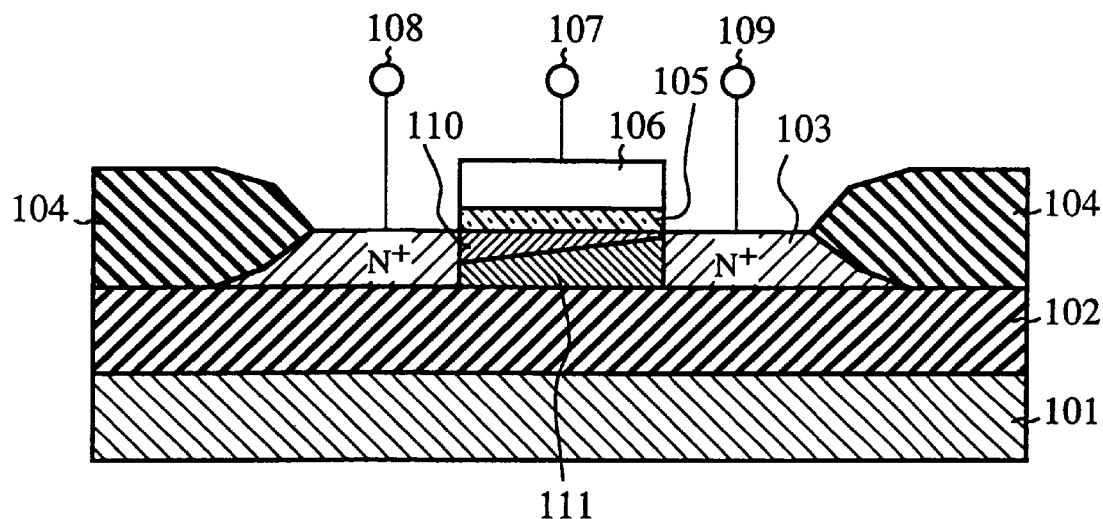
FIG. 10 is a cross-sectional view showing an NMOS transistor activated in a conventional perfect depletion type mode.
Figure 11:
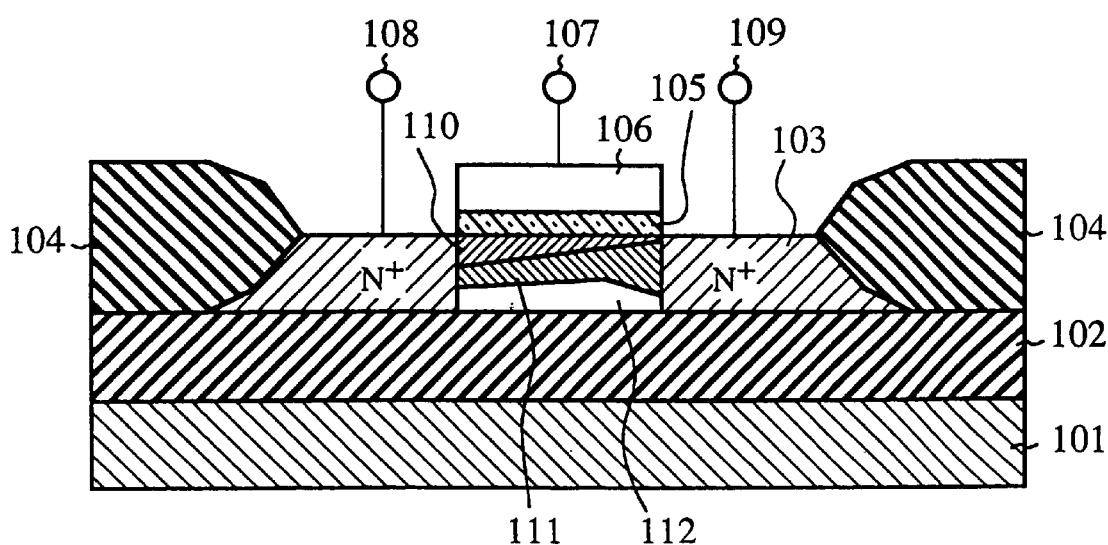
FIG. 11 is a cross-sectional view showing a partial depletion type device.
Figure 12:
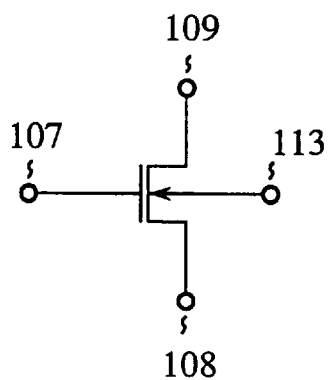
FIG. 12 is a typical view illustrating the symbol of an NMOS transistor.
Figure 13:
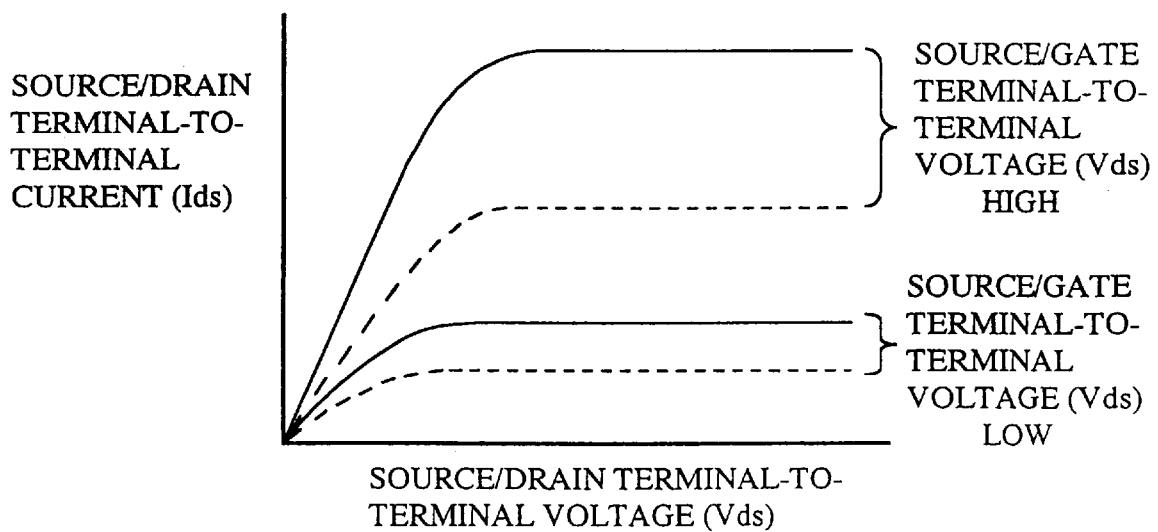
FIG. 13 is a graph for describing the relationship between a source/drain terminal-to-terminal voltage (Vds) and a source/drain terminal-to-terminal current (Ids).

FIG. 9 is a configurational view showing inverter gates whose body voltages, i.e., potentials in the body region, are controlled, which are employed in a fourth embodiment of the present invention. In FIG. 9, reference numerals 23, reference numeral 24, reference numeral 25, reference numeral 26, and reference numeral 27 indicate an input terminal, an output terminal, a power terminal, PMOS, and NMOS, respectively.

The operation will next be described.

Body electrodes of the NMOS 27 and PMOS 26 are electrically connected to their corresponding gate terminals. The electrical connection of the body electrodes to their corresponding gate terminals allows a high-speed operation as described above. A large merit is obtained when the body electrodes are used in a region for driving large capacity of an input/output buffer or the like.

According to the fourth embodiment, as has been described above, an advantageous effect can be obtained in that the electrical connection of body electrodes to their corresponding gate terminals permits a high-speed operation and particularly when the body electrodes are used in a region for driving large capacity of an input/output buffer or the like, they provide a great merit, whereby an integrated circuit capable of high-speed operation can be obtained.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor integrated circuit device comprising:

MOS devices respectively formed on a wafer having a thick silicon layer and a thin silicon layer formed on a buried oxide film, said MOS device formed in said thick silicon layer being activated in a partial depletion type mode and said MOS device formed in said thin silicon layer being activated in a perfect depletion type mode:

wherein each of said MOS devices has a CMOS structure.

2. A semiconductor integrated circuit device comprising:

MOS devices respectively formed on a wafer having a thick silicon layer and a thin silicon layer formed on a buried oxide film, said MOS device formed in said thick silicon layer being activated in a partial depletion type mode and said MOS device formed in said thin silicon layer being activated in a perfect depletion type mode;

input/output buffer regions activated in a partial depletion type mode; and an internal circuit region activated in a perfect depletion type mode.

3. A semiconductor integrated circuit device according to claim 1, wherein gate electrodes of the CMOS including PMOS and NMOS are connected to their body electrodes respectively.

4. A semiconductor integrated circuit device comprising:

MOS devices respectively formed on a wafer having a thick silicon layer and a thin silicon layer formed on a buried oxide film, said MOS device formed in said thick silicon layer being activated in a partial depletion type mode and said MOS device formed in said thin silicon layer being activated in a perfect depletion type mode;

wherein the MOS device operating at the perfect depletion type mode has a body which is in an electrically floating state and the MOS device operating at the partial depletion type mode has a body, a potential of which is controlled in synchronism with a switching operation of the MOS device operating at the perfect depletion type mode.

* * * * *